(12) United States Patent
Lee et al.

(10) Patent No.: US 8,278,640 B2
(45) Date of Patent: Oct. 2, 2012

(54) RESISTIVE RANDOM ACCESS MEMORY DEVICES AND RESISTIVE RANDOM ACCESS MEMORY ARRAYS HAVING THE SAME

(75) Inventors: Dong-soo Lee, Gunpo-si (KR);
Chang-bum Lee, Seoul (KR);
Chang-jung Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 93 days.

(21) Appl. No.: 12/805,783

(22) Filed: Aug. 19, 2010

(65) Prior Publication Data
US 2011/0147696 A1    Jun. 23, 2011

(30) Foreign Application Priority Data
Dec. 23, 2009    (KR) .................. 10-2009-0130033

(51) Int. Cl.
*H01L 29/02* (2006.01)

(52) U.S. Cl. .... 257/2; 257/3; 257/4; 257/5; 257/E29.02; 438/102; 438/103

(58) Field of Classification Search .................. 257/2–5, 257/E29.002; 438/102–103
See application file for complete search history.

(56) References Cited

U.S. PATENT DOCUMENTS

2007/0200158 A1*    8/2007    Genrikh et al. ............... 257/306

FOREIGN PATENT DOCUMENTS

| JP | 2008-098537 | 4/2008 |
| JP | 2008-177469 | 7/2008 |
| KR | 10-2007-0111840 | 11/2007 |
| KR | 10-0790882 | 12/2007 |
| KR | 10-2008-0000358 | 1/2008 |

OTHER PUBLICATIONS

"Electron Work Functions of the Elements" in CRC Handbook of Chemistry and Physics, Internet Version 2007, (87th edition), David R. Lide, ed., Taylor and Francis, Boca Raton FL, is provided as a teaching reference.*

* cited by examiner

*Primary Examiner* — Jami M Valentine
(74) *Attorney, Agent, or Firm* — Harness, Dickey & Pierce, P.L.C.

(57) ABSTRACT

A resistive random access memory (RRAM) devices and resistive random access memory (RRAM) arrays are provided, the RRAM devices include a first electrode layer, a variable resistance material layer formed of an oxide of a metallic material having a plurality of oxidation states, an intermediate electrode layer on the variable resistance material layer and formed of a conductive material having a lower reactivity with oxygen than the metallic material, and a second electrode layer on the intermediate electrode layer. The RRAM arrays include at least one of the aforementioned RRAM devices.

9 Claims, 5 Drawing Sheets

RESISTIVE RANDOM ACCESS MEMORY DEVICES AND RESISTIVE RANDOM ACCESS MEMORY ARRAYS HAVING THE SAME

CROSS-REFERENCE TO RELATED APPLICATIONS

This application claims the benefit of priority under 35 U.S.C. §119 from Korean Patent Application No. 10-2009-0130033, filed on Dec. 23, 2009, in the Korean Intellectual Property Office, the disclosure of which is incorporated herein in its entirety by reference.

BACKGROUND

1. Field

Example embodiments relate to resistive random access memory (RRAM) devices and resistive random access memory arrays having the same.

2. Description of the Related Art

Semiconductor memory devices have been actively researched and developed with respect to integration, operation speed and/or driving power. Dynamic random access memory (DRAM), as a representative semiconductor memory device, has high integration and operation speed but is a volatile memory device that loses all stored data when power is off.

A flash memory has lower integration and operation speed than DRAM but is a non-volatile memory device that retains stored data even when power is off. Non-volatile memory devices include magnetic random access memory (MRAM), ferroelectric random access memory (FRAM), phase-change random access memory (PRAM) and resistance random access memory (RRAM).

RRAM uses a variable resistance material having a resistance that varies at a certain voltage. For example, if a set voltage is applied to the variable resistance material, the resistance of the variable resistance material is reduced so as to be in an on state. If a reset voltage is applied, the resistance of the variable resistance material is increased so as to be in an off state. The variable resistance material of the RRAM may also have various resistance values according to an applied voltage. As such, a relatively high recording density may be realized.

SUMMARY

Example embodiments relate to resistive random access memory (RRAM) devices and resistive random access memory arrays having the same.

Provided are resistive random access memory (RRAM) devices having variable resistive characteristics of multi-levels.

Additional aspects will be set forth in part in the description which follows and, in part, will be apparent from the description, or may be learned by practice of the presented example embodiments.

According to example embodiments, a resistive random access memory (RRAM) device includes a first electrode layer, a variable resistance material layer formed of an oxide of a metallic material having a plurality of oxidation states, an intermediate electrode layer formed on the variable resistance material layer and formed of a conductive material having a lower reactivity with oxygen in comparison to a metallic material, and a second electrode layer formed on the intermediate electrode layer.

The intermediate electrode layer may be formed of a conductive oxide. The intermediate electrode layer may be formed of indium tin oxide (ITO) or indium zinc oxide (IZO).

The variable resistance material layer may be formed of tantalum (Ta) oxide, nickel (Ni) oxide, titanium (Ti) oxide, iron (Fe) oxide, cobalt (Co) oxide, manganese (Mn) oxide, tungsten (W) oxide or an alloy or mixture thereof. The variable resistance material layer may have bipolar memory characteristics. The variable resistance material layer may have multi-level variable resistance characteristics (i.e., have a different resistance value according to an applied voltage).

The variable resistance material layer may be formed of tantalum (Ta) oxide, and the intermediate electrode layer may be formed of ITO.

The second electrode layer may be formed of a metallic material having a higher work function than Ta. For example, the second electrode layer may be formed of platinum (Pt). In this case, the variable resistance material layer may have self-rectifying characteristics.

The second electrode layer may be formed of a metallic material having a lower work function than Ta. For example, the second electrode layer may be formed of aluminum (Al).

The first electrode layer may be formed of platinum (Pt), ruthenium (Ru), iridium (Ir), nickel (Ni), cobalt (Co), chromium (Cr), tungsten (W), copper (Cu), or an alloy or mixture thereof.

The resistive random access memory (RRAM) arrays according to example embodiments include a plurality of first RRAM devices each disposed between a first electrode line and a second electrode line, and a plurality of second RRAM devices each disposed between the second electrode line and a third electrode line. Each of the first and second RRAM devices is configured as one of the aforementioned RRAM devices.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
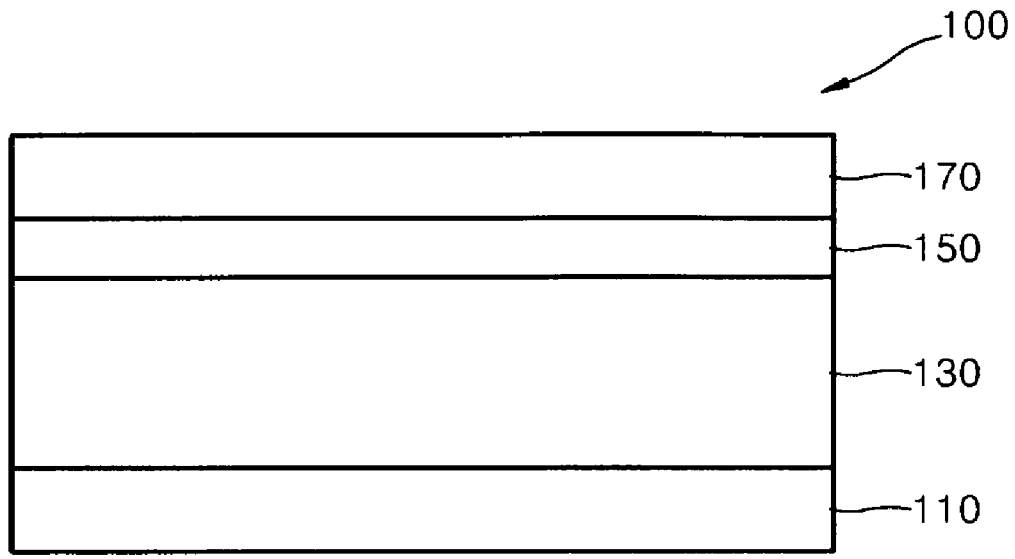
FIG. 1 is a schematic cross-sectional view of a resistive random access memory (RRAM) device according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

In order to more specifically describe example embodiments, various aspects will be described in detail with reference to the attached drawings. However, the present invention is not limited to example embodiments described.

Example embodiments relate to resistive random access memory (RRAM) devices and resistive random access memory arrays having the same.

FIG. 1 is a schematic cross-sectional view of a resistive random access memory (RRAM) device according to example embodiments.

Referring to FIG. 1, a RRAM device 100 includes a first electrode layer 110, a variable resistance material layer 130, an intermediate electrode layer 150 and a second electrode layer 170.

The variable resistance material layer 130 has a resistance value that varies according to an applied voltage. The variable resistance material layer 130 is generally formed of a material having a variable resistance due to a conduction path that varies according to movement of oxygen. According to example embodiments, the variable resistance material layer 130 is formed of an oxide of a metallic material having a plurality of oxidation states. For example, an oxide of tantalum (Ta), nickel (Ni), titanium (Ti), iron (Fe), cobalt (Co), manganese (Mn), tungsten (W) or an alloy or mixture thereof may be used.

The intermediate electrode layer 150 is formed of a conductive material having a lower reactivity with oxygen in comparison to a metallic material.

The intermediate electrode layer 150 is used to increase memory characteristics of the variable resistance material layer 130. Resistance characteristics of the variable resistance material layer 130 depend on the movement of oxygen in the variable resistance material layer 130. The degree of charge trapping varies according to the movement of oxygen such that a low resistance state or a high resistance state is realized. Because the intermediate electrode layer 150 is disposed between the variable resistance material layer 130 and the second electrode layer 170, a region having sufficient (or a set amount of) oxygen (not shown, hereinafter referred to as an 'oxygen region') is formed on an interface between the variable resistance material layer 130 and the intermediate electrode layer 150. The oxygen region may have a nano-order thickness. The intermediate electrode layer 150 is formed of a material having a substantially low reactivity with oxygen, and thus the above-described oxygen region is maintained (and does not disappear due to a reaction with the metallic material used to form the second electrode layer 170).

The oxygen region performs a function that is important for (or affects) memory performance. For example, if oxygen in the oxygen region reacts with a metal having a substantially high reactivity with oxygen, the oxygen region disappears and a variation in resistance is no longer observed. The intermediate electrode layer 150 may be formed of a conductive oxide (e.g., indium tin oxide (ITO) or indium zinc oxide (IZO)).

The first electrode layer 110 and the second electrode layer 170 are used to apply a voltage to the variable resistance material layer 130. The first electrode layer 110 and the second electrode layer 170 may be formed of a conductive material. The first electrode layer 110 may be formed of platinum (Pt), ruthenium (Ru), iridium (Ir), nickel (Ni), cobalt (Co), chromium (Cr), tungsten (W), copper (Cu), or an alloy or mixture thereof. The second electrode layer 170 may also be formed of Pt, Ru, Ir, Ni, Co, Cr, W, Cu, or an alloy or mixture thereof.

When the second electrode layer 170 is formed on the intermediate electrode layer 150, the material used to form the second electrode layer 170 may be selected from numerous materials in comparison to when the intermediate electrode layer 150 is not present. For example, if the second electrode layer 170 is formed on the variable resistance material layer 130 (e.g., formed of tantalum (Ta) oxide), the material of the second electrode layer 170 must be a metallic material having a higher work function than tantalum (Ta) so that the metallic material of the second electrode layer 170 does not to react with oxygen in the variable resistance material layer 130.

Generally, when electron conduction paths of the variable resistance material layer 130 disappear due to the movement of oxygen, variable resistance characteristics are realized. However, the variable resistance material layer 130 may lose its variable resistance characteristics if oxygen in the variable resistance material layer 130 reacts with an electrode material and an oxide film is formed. As such, it may be necessary to use a precious metallic material (e.g., Pt, Ir or Ru) for the second electrode layer 170, increasing the unit cost of a RRAM device.

According to example embodiments, when the intermediate electrode layer 150 is used (or is present), the second electrode layer 170 may be formed of a metallic material having a lower work function than Ta in addition to a metallic material having a higher work function than Ta. For example, the second electrode layer 170 may additionally be formed of an inexpensive metallic material (e.g., aluminum (Al)).

A switching device (not shown) may be formed between the first electrode layer 110 and the variable resistance material layer 130. For example, the switching device may be a diode or a varistor.

The performance of a RRAM device according to example embodiments will now be described.

Figure 2:
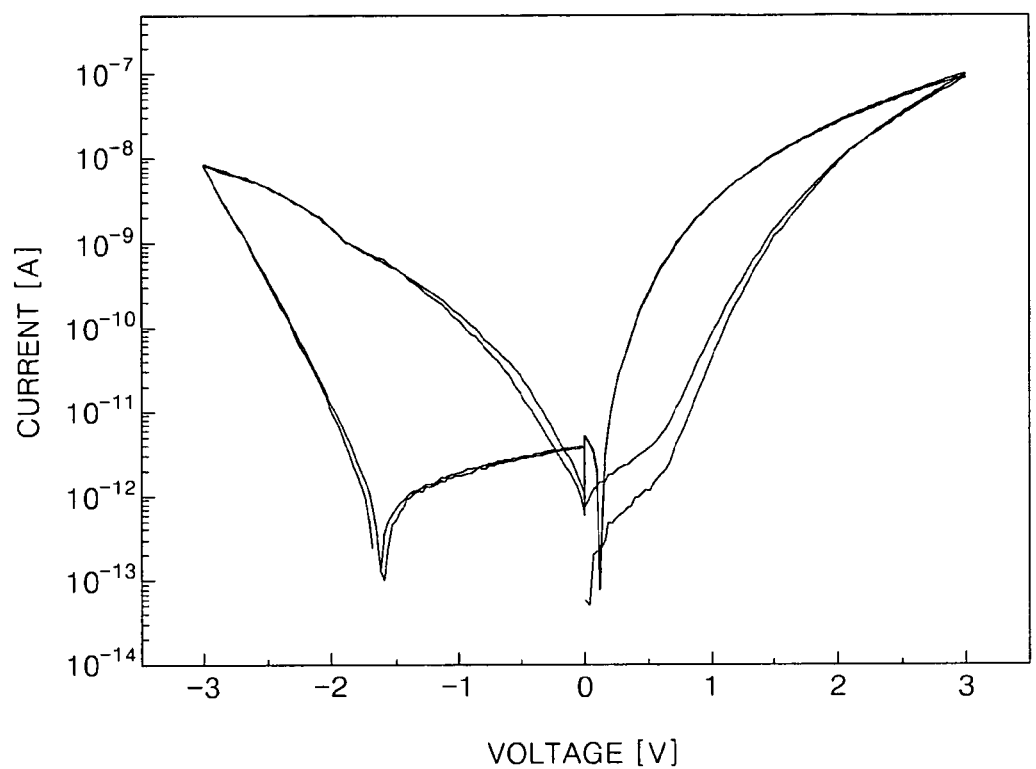
FIG. 2 is a graph showing voltage-current characteristics, with respect to an initial sweep, of a RRAM device according to example embodiments.

FIG. 2 is a graph showing voltage-current characteristics of a RRAM device according to example embodiments with respect to an initial sweep.

The RRAM device used in FIG. 2 is configured like the RRAM device illustrated in FIG. 1, and includes a variable resistance material layer formed of Ta oxide, an intermediate electrode layer formed of ITO, and a second electrode layer formed of Al. The graph of FIG. 2 is an initial sweep graph and shows bipolar memory characteristics.

As shown in the graph of FIG. 2, the RRAM device does not require a process, such as, the application a high voltage in a programming operation. During a process, such as the application of a high voltage, a soft dielectric breakdown is generated by applying electrical stress in order to form conduction paths in a variable resistance material. Such a process forms random conduction paths, thus causing uneven resistance dispersion. In the RRAM device, the oxygen region (which is formed on (or at) an interface between the variable resistance material layer 130 and the intermediate electrode layer 150) is not destroyed, and thus a variation in resistance occurs.

Figure 3:
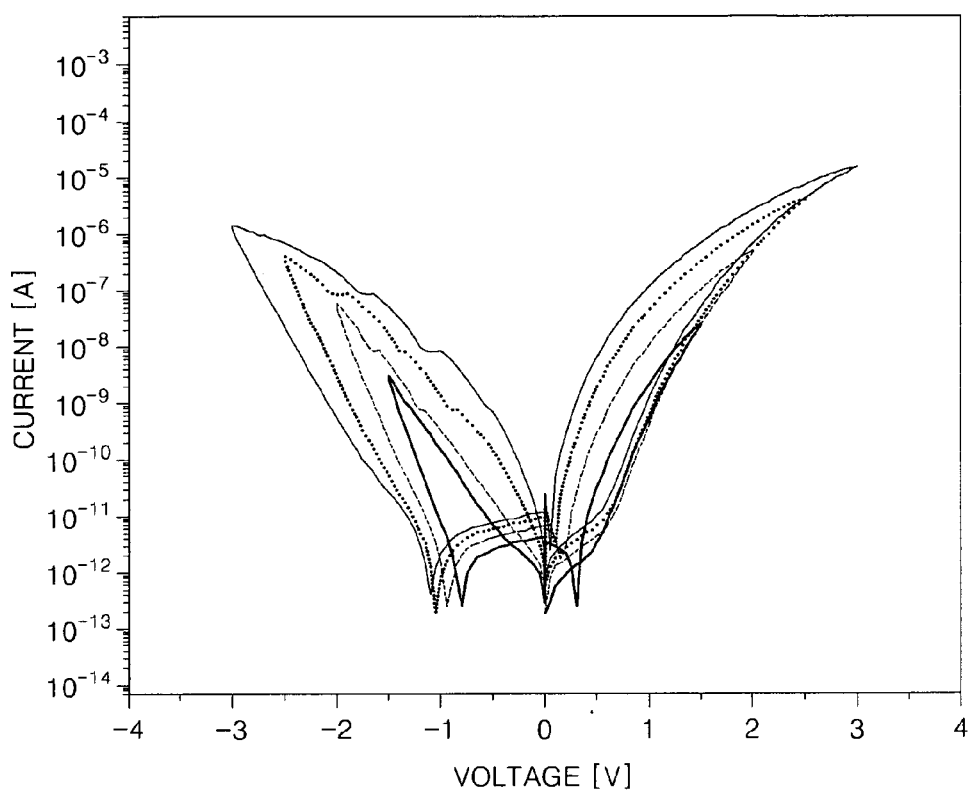
FIG. 3 is a graph showing voltage-current characteristics, with respect to various applied voltage ranges, of a RRAM device according to example embodiments.

FIG. 3 is a graph showing voltage-current characteristics of a RRAM device according to example embodiments with respect to various applied voltage ranges.

The RRAM device used in FIG. 3 is configured like the RRAM device illustrated in FIG. 1, and includes a variable resistance material layer formed of Ta oxide and an intermediate electrode layer formed of ITO.

As shown in the graph of FIG. 3, the RRAM device has different resistance characteristics (i.e., multi-level resistance characteristics) for all four applied voltage ranges. The variable resistance characteristics are observed because the movement of oxygen ions varies according to an applied voltage in the oxygen region formed on an interface between the variable resistance material layer 130 and the intermediate electrode layer 150. The movement of oxygen ions influences a degree of charge trapping and is at least one reason that a variation in the resistance occurs. If the RRAM device exhibits multi-level resistance characteristics, the RRAM device may be more appropriately used as a memory device for recording large-sized data. The RRAM device having multi-level resistance characteristics is useful as a memory device for recording large-sized data because a recording capacity in a unit size increases if multi-level resistance values (greater than two resistance values) are used in comparison to a two-bit operation for identifying only on/off states by using two resistance values.

Figure 4:
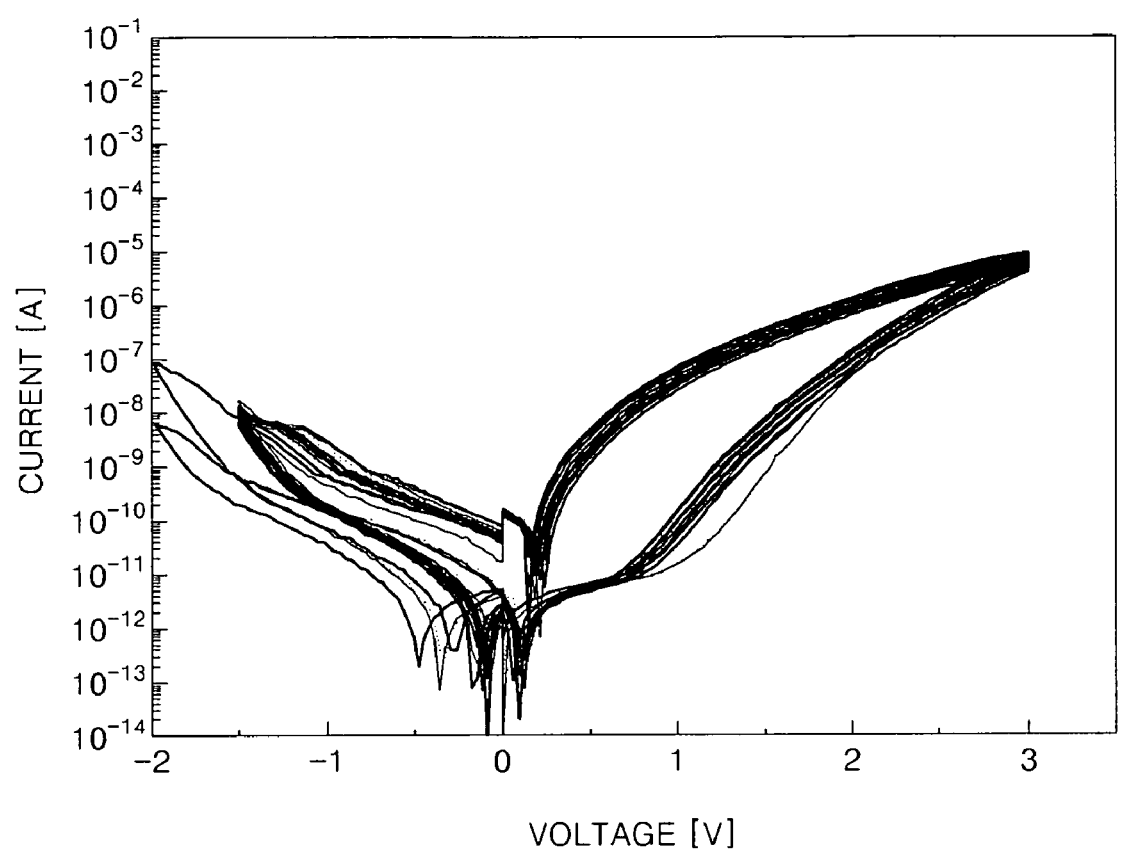
FIG. 4 is a graph showing voltage-current characteristics when platinum (Pt) is used to form a second electrode layer of in a RRAM device according to example embodiments.

FIG. 4 is a graph showing voltage-current characteristics when Pt is used to form the second electrode layer in a RRAM device according to example embodiments.

The RRAM device used in FIG. 4 is configured like the RRAM device illustrated in FIG. 1, and includes a variable resistance material layer formed of Ta oxide, an intermediate electrode layer formed of ITO, and a second electrode layer formed of Pt.

As shown in the graph of FIG. 4, a current level is low at an inverse bias voltage, and the variable resistance material layer exhibits self-rectifying characteristics. The low current level observed at the inverse bias voltage and self-rectifying characteristics occur because a Schottky barrier is formed between Pt having a high work function and Ta oxide having semiconductor characteristics.

The RRAM device according to example embodiments may be applied to a memory array.

Figure 5:
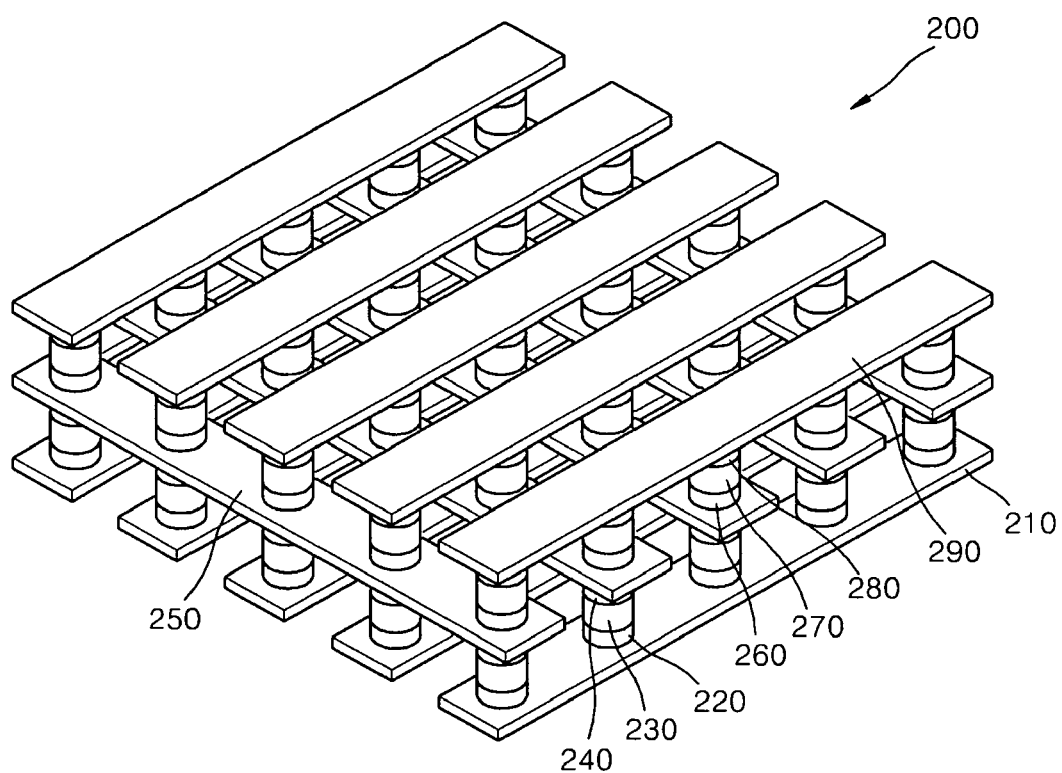
FIG. 5 is a perspective view of an RRAM array according to example embodiments.

FIG. 5 is a perspective view of an RRAM array according to example embodiments.

Referring to FIG. 5, the memory array 200 includes first electrode lines 210 formed in a first direction, a first switch device 220 formed on the first electrode lines 210, a first variable resistance material layer 230, a first intermediate electrode layer 240, second electrode lines 250 formed on the first intermediate electrode layer 240 in a second direction, a second switch device 260 formed on the second electrode lines 250, a second variable resistance material layer 270, a second intermediate electrode layer 280, and third electrode lines 290 formed on the second intermediate electrode layer 280 in the first direction. Each of the first and second variable resistance material layers 230 and 270 is formed of an oxide of a metallic material having a plurality of oxidation states. For example, an oxide of Ta, Ni, Ti, Fe, Co, Mn, W or mixtures thereof may be used.

Each of the first and second intermediate electrode layers 240 and 280 may be formed of a conductive material having a lower reactivity with oxygen in comparison to a metallic material. For example, a conductive oxide (e.g., ITO or IZO) may be used.

As described above, according to example embodiments, a RRAM device has bipolar multi-level resistance characteristics and thus may realize a substantially high recording density.

The RRAM device may use an inexpensive metallic material (e.g., Al) as an electrode material in addition to a precious metallic material, and thus may reduce manufacturing costs.

The RRAM device according to example embodiments does not require a process, such as the application of a high voltage in a programming operation, and thus resistance dispersion due to uneven conduction paths may be reduced (or prevented).

It should be understood that the example embodiments described therein should be considered in a descriptive sense only and not for purposes of limitation. Descriptions of features, or aspects, within each example embodiment should typically be considered as available for other similar features, or aspects, in other example embodiments. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims.

What is claimed is:

1. A resistive random access memory (RRAM) device, comprising:
    a first electrode layer;
    a variable resistance material layer formed of a metallic oxide material having a plurality of oxidation states;
    an intermediate electrode layer on the variable resistance material layer, the intermediate electrode layer formed of a conductive material having a lower reactivity with oxygen than the metallic oxide material; and
    a second electrode layer on the intermediate electrode layer, wherein the second electrode layer includes aluminum (Al).

2. The RRAM device of claim 1, wherein the intermediate electrode layer is formed of a conductive oxide.

3. The RRAM device of claim 2, wherein the intermediate electrode layer is formed of indium tin oxide (ITO) or indium zinc oxide (IZO).

4. The RRAM device of claim 1, wherein the metallic oxide material is at least one oxide selected from the group consisting of tantalum (Ta) oxide, nickel (Ni) oxide, titanium (Ti) oxide, iron (Fe) oxide, cobalt (Co) oxide, manganese (Mn) oxide, tungsten (W) oxide and mixtures thereof.

5. The RRAM device of claim 1, wherein the variable resistance material layer has bipolar memory characteristics.

6. The RRAM device of claim 1, wherein the variable resistance material layer has multi-level variable resistance characteristics having a different resistance value according to an applied voltage.

7. The RRAM device of claim 6, wherein the metallic oxide is tantalum (Ta) oxide, and
    wherein the intermediate electrode layer is formed of ITO.

8. The RRAM device of claim 1, wherein the first electrode layer is formed of one selected from the group consisting of platinum (Pt), ruthenium (Ru), iridium (Ir), nickel (Ni), cobalt (Co), chromium (Cr), tungsten (W), copper (Cu) and mixtures thereof.

9. A resistive random access memory (RRAM) array, comprising:
    a plurality of first RRAM devices each disposed between a first electrode line and a second electrode line; and
    a plurality of second RRAM devices each disposed between the second electrode line and a third electrode line,
    wherein each of the first and second RRAM devices is the RRAM device according to claim 1.

* * * * *